(12) United States Patent
Ollitervo

(10) Patent No.: US 12,373,195 B2
(45) Date of Patent: Jul. 29, 2025

(54) METHOD OF PROGRAMMING A SOFTWARE MODULE ASSOCIATED WITH A FIRMWARE UNIT OF A DEVICE

(71) Applicant: Siemens Industry Software Inc., Plano, TX (US)

(72) Inventor: Sakari Ollitervo, Pohjois-Pohjanmaa (FI)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 18/023,719

(22) PCT Filed: Aug. 28, 2020

(86) PCT No.: PCT/EP2020/074102
§ 371 (c)(1),
(2) Date: Feb. 27, 2023

(87) PCT Pub. No.: WO2022/042854
PCT Pub. Date: Mar. 3, 2022

(65) Prior Publication Data
US 2024/0012639 A1 Jan. 11, 2024

(51) Int. Cl.
*G06F 8/71* (2018.01)
*G06F 8/30* (2018.01)
(52) U.S. Cl.
CPC ............... *G06F 8/71* (2013.01); *G06F 8/311* (2013.01)
(58) Field of Classification Search
None
See application file for complete search history.

(56) References Cited

U.S. PATENT DOCUMENTS 6,083,282 A * 7/2000 Caron ................... G06F 8/436
717/142
6,487,698 B1 * 11/2002 Andreev ................ G06F 30/30
717/136
(Continued)

FOREIGN PATENT DOCUMENTS

CN 103324511 A 9/2013
CN 103324512 A 9/2013
(Continued)

OTHER PUBLICATIONS

International Search Report and Written Opinion for International App. PCT/EP2020/074102 mailed May 31, 2021.

*Primary Examiner* — Ryan D. Coyer
(74) *Attorney, Agent, or Firm* — Lempia Summerfield Katz LLC

(57) ABSTRACT

A method of programming a software module associated with a firmware unit of a device is provided. The method includes obtaining a register transfer level program associated with the firmware unit. The register transfer level program includes a plurality of register variables indicative of a plurality of registers in the firmware unit, defined within a first namespace of the register transfer level program. The method includes linking the first namespace associated with the register transfer level program with a namespace associated with a software module for referencing at least one register variable from the plurality of register variables. The register transfer level program includes design level description of one or more operations associated with the firmware unit in a high-level programming language.

17 Claims, 3 Drawing Sheets

(56) References Cited

U.S. PATENT DOCUMENTS

| | | | |
|---|---|---|---|
| 2001/0037417 A1* | 11/2001 | Meyer | H04L 9/40 |
| | | | 719/315 |
| 2005/0102488 A1 | 5/2005 | Bullis | |
| 2007/0245294 A1 | 10/2007 | Saito | |
| 2011/0276929 A1* | 11/2011 | Imai | G06F 30/33 |
| | | | 716/102 |
| 2012/0017185 A1* | 1/2012 | Padmanabhan | G06F 30/3308 |
| | | | 716/104 |
| 2012/0017187 A1* | 1/2012 | Padmanabhan | G06F 30/3308 |
| | | | 716/106 |
| 2012/0017189 A1* | 1/2012 | Durbha | G06F 30/337 |
| | | | 716/113 |
| 2012/0017198 A1 | 1/2012 | Ng | |
| 2013/0212365 A1 | 8/2013 | Chen | |
| 2013/0212366 A1 | 8/2013 | Chen | |
| 2013/0263067 A1* | 10/2013 | Padmanabhan | G06F 30/337 |
| | | | 716/102 |
| 2013/0346926 A1* | 12/2013 | Pandurangan | G06F 30/30 |
| | | | 716/132 |

FOREIGN PATENT DOCUMENTS

| | | |
|---|---|---|
| WO | 2015200930 A1 | 12/2015 |
| WO | 2017149737 A1 | 9/2017 |

* cited by examiner

```
#ifndef TOP_MODULE_H__
#define TOP_MODILE_H__
#include "TopCommon.h"
#include "Submodule1.h"
#include "Submodule2.h"
#pragma hls_design
class topmodule {
// Sub-instances
Submodule1 module1;
Submodule2 module2;
//Interconnect channels
ac-channel<iqSample_t> sampleSum;
public:
Topmodule () {}
#pragma hls_design interface
viod CCS_BLOCK (run) (bool sRst,
bool en,
iqSamplePair sample,
ac_int<COEFFICIENT_BIT_WIDTH, false> coefficient,
iqSample_t &sampleOut) {
module1.run (sRst, en, sample, sampleSum);
module2.run (coefficient, sampleSum, sampleOut);
}
};
#endif /* TOP_MODULE_H__ */
```

320

```
topModule.sRst ->set(1);
ac_int<1, false> readValue = topModule.sRst ->get()
if (readValue == 1)
  topModule.sRST ->set(0);
```

METHOD OF PROGRAMMING A SOFTWARE MODULE ASSOCIATED WITH A FIRMWARE UNIT OF A DEVICE

This application is the National Stage of International Application No. PCT/EP2020/074102, filed Aug. 28, 2020. The entire contents of this document are hereby incorporated herein by reference.

BACKGROUND

The current disclosure relates to design and programming of firmware and, more particularly, to register transfer level based design of firmware using high level synthesis tools. High level synthesis tools enable a programmer to provide a high level description of the one or more operations associated with the related firmware unit using a high level language such as SystemC or ANSI C/C++. From these high-level descriptions, high level synthesis tools may then generate production-quality RTL, which then may be used to generate lower-level representations and ultimately, actual wiring of the firmware unit.

The current disclosure relates to design and programming of firmware units (also referred to as firmware modules) of devices. Conventionally, the development of software for a firmware device happens in two phases. In a first phase, the operations to be performed by the firmware are described by a programmer using register transfer level (RTL) modules. Subsequent to the creation of the RTL module, the programmer is to manually create a register module (also referred to register interface module) for the corresponding RTL module, for enabling register read and write operations. The register interface module includes definitions for register addresses, bit offsets, and bit widths for every configuration in RTL module. In a second phase, one or more application programming interfaces referring the RTL module are developed. During this stage, the register interface module is used by the programmer for enabling the APIs to access (e.g., read and write) the registers. Additionally, the programmer is to define the software that uses register interface module. In this software, there is to be same register addresses and bit masks as in the register interface module.

Currently, the manual generation of the register interface module is time consuming and is prone to manual errors. The programmer is to define register addresses and bit masks for every configuration in the RTL module. Errors in the register interface module may result in improper write operations that lead to unauthorized overwriting of values in the registers.

SUMMARY AND DESCRIPTION

There is a need for a method and device that address the above mentioned issue.

The current disclosure describes a method, a programming device, and a non-transitory storage medium that address the above-mentioned aspects.

The current disclosure describes a method of programming a software module associated with a firmware unit of a device. The method includes obtaining a register transfer level program associated with the firmware unit. The register transfer level program includes a plurality of register variables indicative of a plurality of registers in the firmware unit, defined within a first namespace of the register transfer level program. The method includes linking the first namespace associated with the register transfer level program with a namespace associated with a software module for referencing at least one register variable from the plurality of register variables. The register transfer level program includes design level description of one or more operations associated with the firmware unit in a high-level programming language.

By introducing namespaces in the register transfer level program using the high level language and by linking the namespace of the register transfer level program with a namespace of the software module, the current disclosure allows the programmer of the software module to directly reference the register variables defined and used in the register transfer level program without the register interface module. Accordingly, the current disclosure provides for fast and error free development of software modules since the development of software modules is no longer dependent on the register interface module.

In an example, the method further includes generating a register interface module based on the plurality of register variables of the register transfer level program. Accordingly, by automating the generation of the register interface, likelihood of manual errors in the register interface is reduced substantially. In an example, the method is performed using a high level synthesis tool.

In an example, the method further includes converting the description of the one or more operations in register transfer level program from the high level programming language to a hardware description language associated with the firmware unit. Accordingly, the converted register module in hardware description language may be used directly by any firmware simulation tool.

In an example, the register interface module is based on a header file, a source file, or the header file and the source file. In an example, the software module includes a top module, an application programming interface, or the top module and the application programming interface. In an example, the high-level programming language is a class based programming language.

In another aspect, the current disclosure describes a programming device for programming a software module associated with a firmware unit of an industrial device. The programming device includes one or more processors connected to a memory module. The one or more processors are configured to obtain a register transfer level program associated with the firmware unit. The register transfer level program includes a plurality of register variables indicative of a plurality of registers in the firmware unit, defined within a first namespace of the register transfer level program. The one or more processors are configured to link the first namespace associated with the register transfer level program with a namespace associated with a software module for referencing at least one register variable from the plurality of register variables. The register transfer level program includes design level description of one or more operations associated with the firmware unit in a high-level programming language.

In another aspect, the current disclosure describes a non transitory storage medium for programming a software module associated with a firmware unit of a device. The non transitory storage medium includes a plurality of instructions that, when executed by one or more processors, cause the one or more processors to obtain a register transfer level program associated with the firmware unit. The register transfer level program includes a plurality of register variables indicative of a plurality of registers in the firmware unit, defined within a first namespace of the register transfer level program. The plurality of instructions, when executed by the one or more processors, cause the one or more processors to link the first namespace associated with the register transfer level program with a namespace associated with a software module for referencing at least one register variable from the plurality of register variables. The register transfer level program includes design level description of one or more operations associated with the firmware unit in a high-level programming language. The advantages of the methods apply to the devices described herein. These aspects are further described in relation FIGS. 1-4.

BRIEF DESCRIPTION OF THE DRAWINGS

FIG. 3 illustrates an example register transfer level program and an example module referencing a register variable from the register transfer level program.

DETAILED DESCRIPTION

Figure 1:
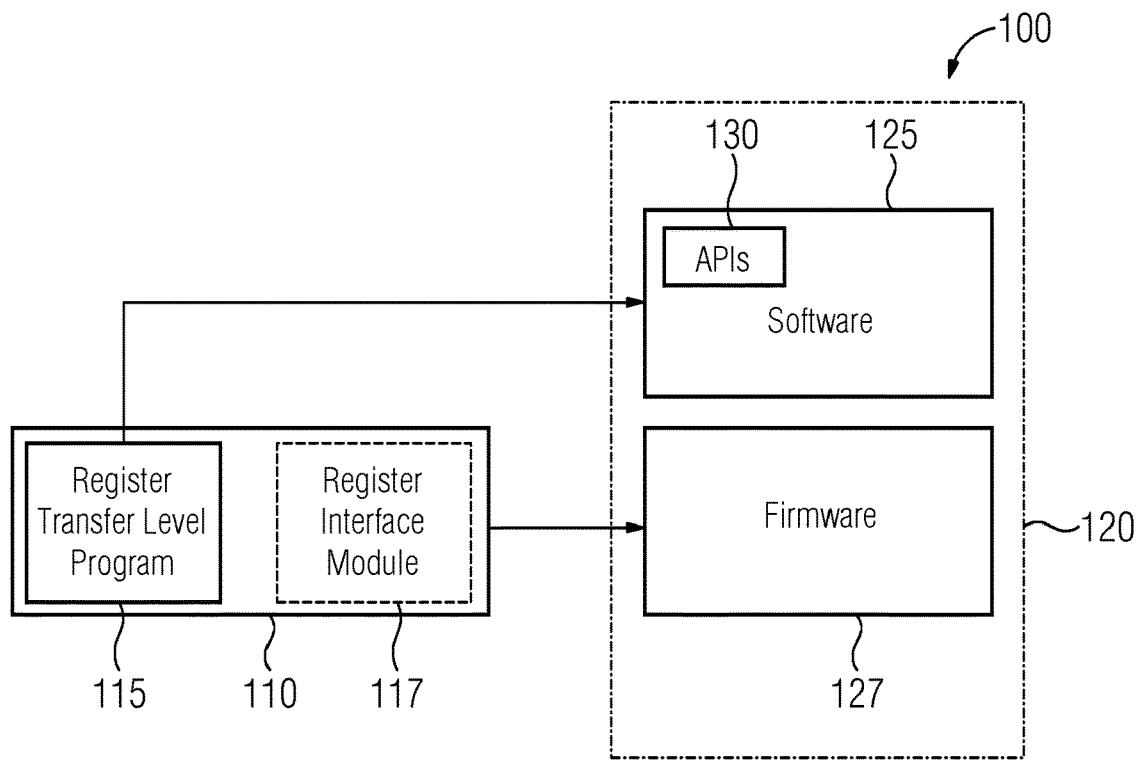
FIG. 1 illustrates a programming environment for a device including a firmware unit and a software module.

FIG. 1 illustrates a programming environment 100 for a device 120 (also referred to as industrial device 120). The device 120 includes a software module 125 and a firmware unit 127. Design and programming of the firmware unit 127 is performed using a high level synthesis tool 110. The high level synthesis tool 110 is used by a programmer to develop one or more register transfer level programs (shown in FIG. 1 as RTL program 115). Each register transfer level program includes definition and description for one or more operations to be performed by the firmware unit 127 of the device 120. Each register transfer level program is written using a high level programming language such as ANSI C++.

Additionally, the high level synthesis tool 110 is connected to a programming tool (not shown in FIG. 1). The programming tool is developing the software module 125. Software module herein refers to one or more programs, software code, etc., in relation to the device 120, and includes graphical user interfaces, application programming interfaces, other firmware programs, etc. The software module 125 performs one or more functions in coordination with the firmware unit 127 of the device 120. Accordingly, the software module 125 interfaces with the firmware unit 127 to invoke operations in the firmware unit 127 and to receive inputs from the firmware unit 127. In this regard, during the software module 125, the programmer may refer to one or more variables or functions defined in the RTL programs associated with the firmware unit 127. In order to provide easy access, the namespace of the RTL programs is included with the namespace of the software module 125 to enable easy refer to the register variables (also referred to as signal variables) defined in the RTL programs. This is further explained with reference to FIG. 2.

Figure 2:
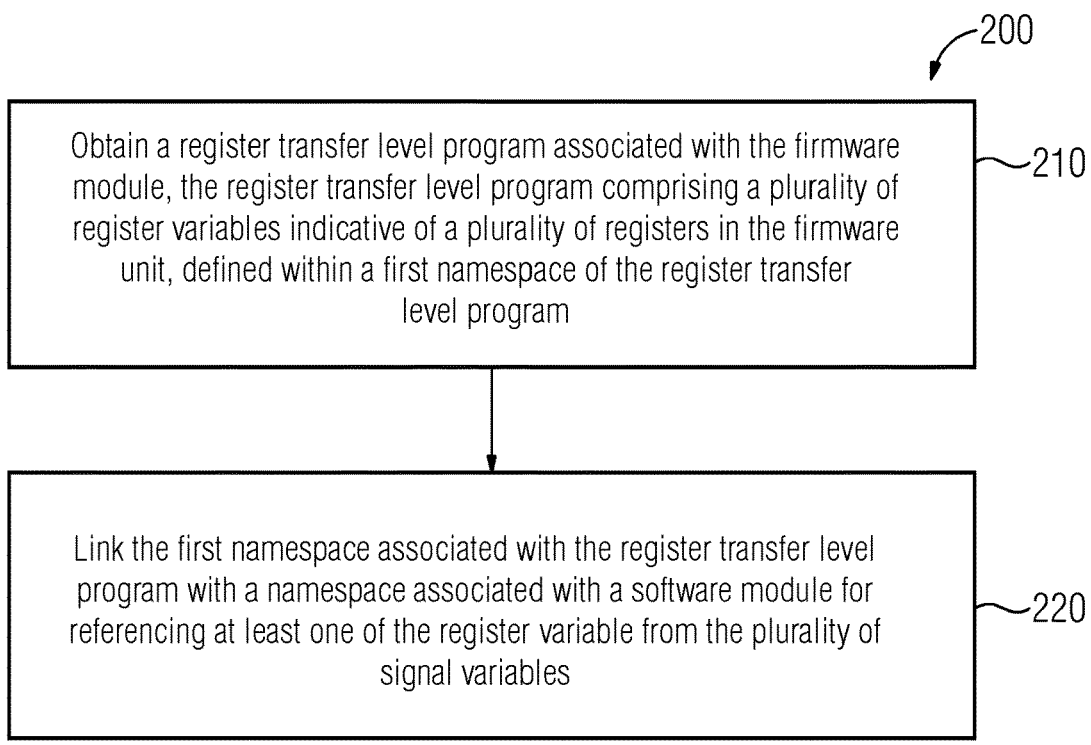
FIG. 2 illustrates a method for programming the software module associated with the firmware unit of the device.
Figure 4:
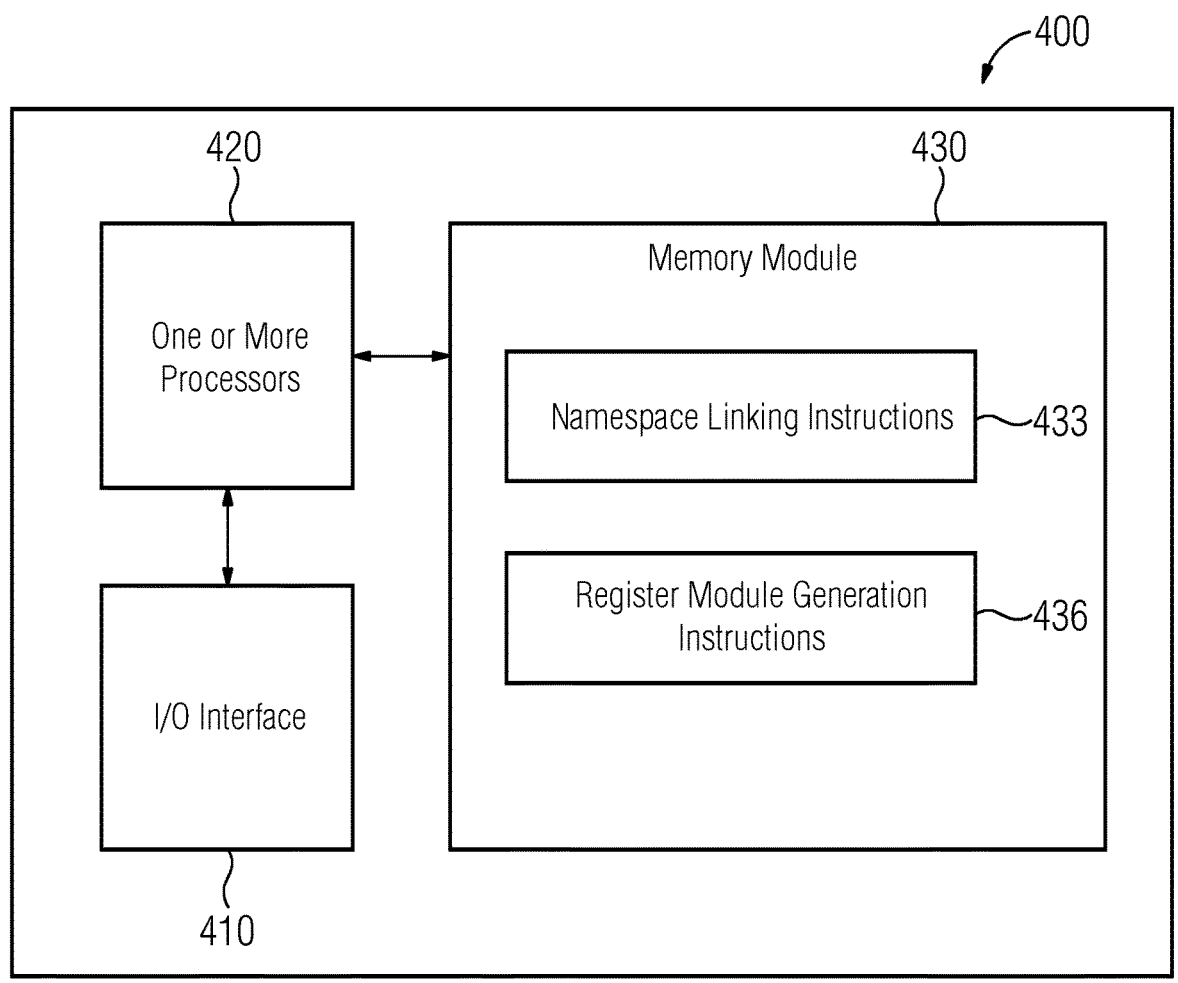
FIG. 4 illustrates a programming device for programming the software module associated with the firmware unit of the device.

FIG. 2 illustrates a method 200 for programming the software module 125 associated with the firmware unit 127 of a device 120. The method 200 may be performed by the high level synthesis tool 110 along with the programming tool. The method 200 includes obtaining a register transfer level program 115 associated with the firmware unit 127. The register transfer level program 115 includes a plurality of operations and functions to be performed by the firmware unit 127, in a high level language. These functions and operations indicate the register variables for receiving inputs values, the processing to be done on the inputs values, and the register variables where the intermediate and final outputs values are to be stored. Each of the register variables corresponds to a corresponding register in the firmware unit 127.

Since the register transfer level program 117 is written using a high level programming language, the register transfer level program 117 includes one or more namespaces within which the register variables and the functions are defined and described. In an example, the high-level programming language is a class based programming language, allowing for namespaces and class inheritance and hierarchy. The usage of namespace is well known in the state of the art and in the present disclosure, relates to one or more hierarchical organization of functions and variables, such that all of the functions and register variables have unique names within the namespace in which they belong. This is further explained using example register transfer level program 310 provided in FIG. 3.

Register transfer level program 310 is an example register transfer level program and defines a header file 'Top Module H'. Additionally, a class TopModule is also defined in the register transfer level program 310. Accordingly, within the register transfer level program 310, a namespace is generated in association with the class TopModule. All the functions and variables within the class definition of TopModule are unique within this namespace and may be referenced using the namespace of the class and the name of function or the variable that is being referenced. For example, as shown in the figure, the register transfer level program 310 defines the register variables 'sRst' that are for resetting the register transfer level program 'en', which is for enabling the register transfer level program.

Then, at act 220, the first namespace associated with the register transfer level program is linked a namespace associated with the software module 125 for referencing at least one register variable from the plurality of register variables. In an example, the linking is done by using operators such as include or import, whereby the contents of the header file are included in the software module development. This is further explained using an example module 320 provided in FIG. 3.

Example module 320 is an example program associated with the software module 125 of the device 120. The example module 320 is dependent on one or more register variables declared in the example register level program 310. Accordingly, to refer these register variables, the example module 320 utilizes the include operator to include or import the header file 'Top Module H'. By including the header file, the linking of namespaces is performed as mentioned above, and accordingly, the example module 320 may refer to the register variables by creating an instance of the class TopModule. For example, as shown in the figure, the example module 320 may refer to the register variable sRst using the above linkage of name spaces.

In an embodiment, the high level synthesis tool 110 is capable of generating a register interface module 117 based on the plurality of register variables of the register transfer level program 115. In the example, the one or more register variables as defined in the register transfer level programs may be selected manually by the programmer from a list of variables, and the high level synthesis tool is configured to automatically generate bit masks for the same. In the example, the register interface module 117 is based on a header file, a source file, or the header file and the source file, and may be automatically linked or included with other software files.

In an embodiment, the high level synthesis tool in coordination with one or more compilers associated with the firmware unit 127 is capable of converting the description of the one or more operations in register transfer level program 115 from the high level programming language to a hardware description language, such as VERILOG, etc., associated with the firmware unit.

The present disclosure may take a form of a computer program product including program modules accessible from computer-usable or computer-readable medium storing program code for use by or in connection with one or more computers, processing units, or instruction execution system. For example, the method 200 and 300 may be realized across one or more programming devices.

Accordingly, the current disclosure describes a programming device 400 for programming a software module associated with a firmware unit of a device. The programming device 400 includes an I/O interface 410 and one or more processors 420 configured to execute a plurality of instructions (e.g., 433, 436) stored on the memory module or non transitory storage medium 430. The I/O interface 510 is for receiving inputs from a programmer for writing or developing the register transfer level programs. Additionally, via the I/O interface 510, the programming device 400 may connect to other devices that may host related programming environments.

Upon execution of the namespace linking instructions 433, the one or more processors 420 are configured to obtain a register transfer level program associated with the firmware unit. The register transfer level program includes a plurality of register variables indicative of a plurality of registers in the firmware unit, defined within a first namespace of the register transfer level program, and link the first namespace associated with the register transfer level program with a namespace associated with a software module for referencing at least one register variable from the plurality of register variables. The register transfer level program includes design level description of one or more operations associated with the firmware unit in a high-level programming language. Upon execution of the register interface module generation instructions 436, the one or more processors 420 generate the register interface module based on the plurality of register variables of the register transfer level program.

For the purpose of this description, a computer-usable or computer-readable non-transitory storage medium may be any apparatus that may contain, store, communicate, propagate, or transport the program for use by or in connection with the instruction execution system, apparatus, or device. The medium may be electronic, magnetic, optical, electromagnetic, infrared, or semiconductor system (or apparatus or device), or propagation mediums in and of themselves as signal carriers are not included in the definition of physical computer-readable medium. The medium may include a semiconductor or solid state memory, magnetic tape, a removable computer diskette, random access memory (RAM), a read only memory (ROM), a rigid magnetic disk, and optical disk such as compact disk read-only memory (CD-ROM), compact disk read/write, and DVD. Both processing units and program code for implementing each aspect of the technology may be centralized or distributed (or a combination thereof) as known to those skilled in the art.

While the current disclosure is described with references to few industrial devices, a plurality of industrial devices may be utilized in the context of the current disclosure. While the present disclosure has been described in detail with reference to certain embodiments, it should be appreciated that the present disclosure is not limited to those embodiments. In view of the present disclosure, many modifications and variations would present themselves to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within their scope. All advantageous embodiments claimed in method claims may also be applied to device/non transitory storage medium claims.

While the present disclosure has been described in detail with reference to certain embodiments, the present disclosure is not limited to those embodiments. In view of the present disclosure, many modifications and variations would present themselves, to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within the scope.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method of programming a software module associated with a firmware unit of a device, the method comprising:
   obtaining a register transfer level program associated with the firmware unit, the register transfer level program comprising a plurality of register variables indicative of a plurality of registers in the firmware unit, defined within a first namespace of the register transfer level program; and
   linking the first namespace associated with the register transfer level program with a namespace associated with the software module for referencing at least one register variable from the plurality of register variables,
   wherein the register transfer level program includes design level description of one or more operations associated with the firmware unit in a high-level programming language.

2. The method of claim 1, further comprising generating a register interface module based on the plurality of register variables of the register transfer level program.

3. The method of claim 1, wherein the method is performed using a high level synthesis tool.

4. The method of claim 1, further comprising converting the design level description of the one or more operations in the register transfer level program from the high-level programming language to a hardware description language associated with the firmware unit.

5. The method of claim 2, wherein the register interface module is based on a header file, a source file, or the header file and the source file.

6. The method of claim 1, wherein the software module includes a top module, an application programming interface, or the top module and the application programming interface.

7. The method of claim 1, wherein the high-level programming language is a class based programming language.

8. A programming device for programming a software module associated with a firmware unit of an industrial device, the programming device comprising:
one or more processors connected to a memory module, the one or more processors configured to:
obtain a register transfer level program associated with the firmware unit, the register transfer level program comprising a plurality of register variables indicative of a plurality of registers in the firmware unit, defined within a first namespace of the register transfer level program; and
link the first namespace associated with the register transfer level program with a namespace associated with the software module for referencing at least one register variable from the plurality of register variables,
wherein the register transfer level program includes design level description of one or more operations associated with the firmware unit in a high-level programming language.

9. In a non-transitory computer-readable storage medium that stores instructions executable by one or more processors for programming a software module associated with a firmware unit of a device, the instructions comprising:
obtaining a register transfer level program associated with the firmware unit, the register transfer level program comprising a plurality of register variables indicative of a plurality of registers in the firmware unit, defined within a first namespace of the register transfer level program; and
linking the first namespace associated with the register transfer level program with a namespace associated with a software module for referencing at least one register variable from the plurality of register variables,
wherein the register transfer level program includes a design level description of one or more operations associated with the firmware unit in a high-level programming language.

10. The non-transitory computer-readable storage medium of claim 9, wherein the instructions further comprise generating a register interface module based on the plurality of register variables of the register transfer level program.

11. The non-transitory computer-readable storage medium of claim 9, wherein the instructions are performed using a high level synthesis tool.

12. The non-transitory computer-readable storage medium of claim 9, wherein the instructions further comprise converting the design level description of the one or more operations in the register transfer level program from the high-level programming language to a hardware description language associated with the firmware unit.

13. The non-transitory computer-readable storage medium of claim 10, wherein the register interface module is based on a header file, a source file, or the header file and the source file.

14. The non-transitory computer-readable storage medium of claim 9, wherein the software module includes a top module, an application programming interface, or the top module and the application programming interface.

15. The non-transitory computer-readable storage medium of claim 9, wherein the high-level programming language is a class based programming language.

16. The non-transitory computer-readable storage medium of claim 9, wherein the register transfer level program further comprises a header file,
wherein linking the first namespace associated with the register transfer level program with the namespace associated with the software module comprises using an operator for including content of the header file in the software module, and wherein the operator is an import operator or an include operator.

17. The method of claim 1, wherein the register transfer level program further comprises a header file,
wherein linking the first namespace associated with the register transfer level program with the namespace associated with the software module comprises using an operator for including content of the header file in the software module, and
wherein the operator is an import operator or an include operator.

* * * * *